United States Patent
Seo et al.

(10) Patent No.: US 11,563,040 B2
(45) Date of Patent: Jan. 24, 2023

(54) METHOD FOR MANUFACTURING DISPLAY APPARATUS

(71) Applicant: Samsung Display Co., Ltd., Yongin-si (KR)

(72) Inventors: Jongoh Seo, Yongin-si (KR); Gyungmin Baek, Yongin-si (KR); Byungsoo So, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 28 days.

(21) Appl. No.: 17/030,977

(22) Filed: Sep. 24, 2020

(65) Prior Publication Data

US 2021/0296374 A1    Sep. 23, 2021

(30) Foreign Application Priority Data

Mar. 18, 2020  (KR) .................. 10-2020-0033305

(51) Int. Cl.
  *H01L 27/12*  (2006.01)
  *H01L 29/786*  (2006.01)
  *H01L 29/66*  (2006.01)
  *H01L 21/02*  (2006.01)
  *H01L 27/32*  (2006.01)

(52) U.S. Cl.
  CPC .... *H01L 27/1274* (2013.01); *H01L 21/02488* (2013.01); *H01L 21/02532* (2013.01); *H01L 21/02592* (2013.01); *H01L 21/02661* (2013.01); *H01L 21/02675* (2013.01); *H01L 27/1222* (2013.01); *H01L 29/66757* (2013.01); *H01L 29/78675* (2013.01); *H01L 27/3262* (2013.01); *H01L 2227/323* (2013.01)

(58) Field of Classification Search
  None
  See application file for complete search history.

(56) References Cited

U.S. PATENT DOCUMENTS

| | | | |
|---|---|---|---|
| 6,432,758 B1 * | 8/2002 | Cheng | H01L 29/66757 257/E21.413 |
| 7,505,155 B2 | 3/2009 | Jang et al. | |
| 11,164,919 B2 * | 11/2021 | Lee | H01L 21/02422 |
| 2004/0238000 A1 * | 12/2004 | Yeo | B08B 3/12 134/1.3 |
| 2005/0136612 A1 * | 6/2005 | Lin | H01L 21/268 438/424 |
| 2020/0161389 A1 | 5/2020 | Lee et al. | |

FOREIGN PATENT DOCUMENTS

| | | | | |
|---|---|---|---|---|
| JP | 2003158135 | * | 5/2003 | ........... H01L 21/336 |
| JP | 2006-208753 | | 8/2006 | |
| KR | 10-0623250 | | 9/2006 | |
| KR | 10-0840323 | | 6/2008 | |
| KR | 10-2009-0103558 | | 10/2009 | |
| KR | 10-2020-0058622 | | 5/2020 | |

* cited by examiner

*Primary Examiner* — Alexander G Ghyka
(74) *Attorney, Agent, or Firm* — Kile Park Reed & Houtteman PLLC

(57) ABSTRACT

A manufacturing method of a display apparatus including preparing a substrate, forming an amorphous silicon layer on the substrate, cleaning the amorphous silicon layer with hydrofluoric acid, crystallizing the amorphous silicon layer into a polycrystalline silicon layer, and forming a metal layer directly on the polycrystalline silicon layer.

20 Claims, 13 Drawing Sheets

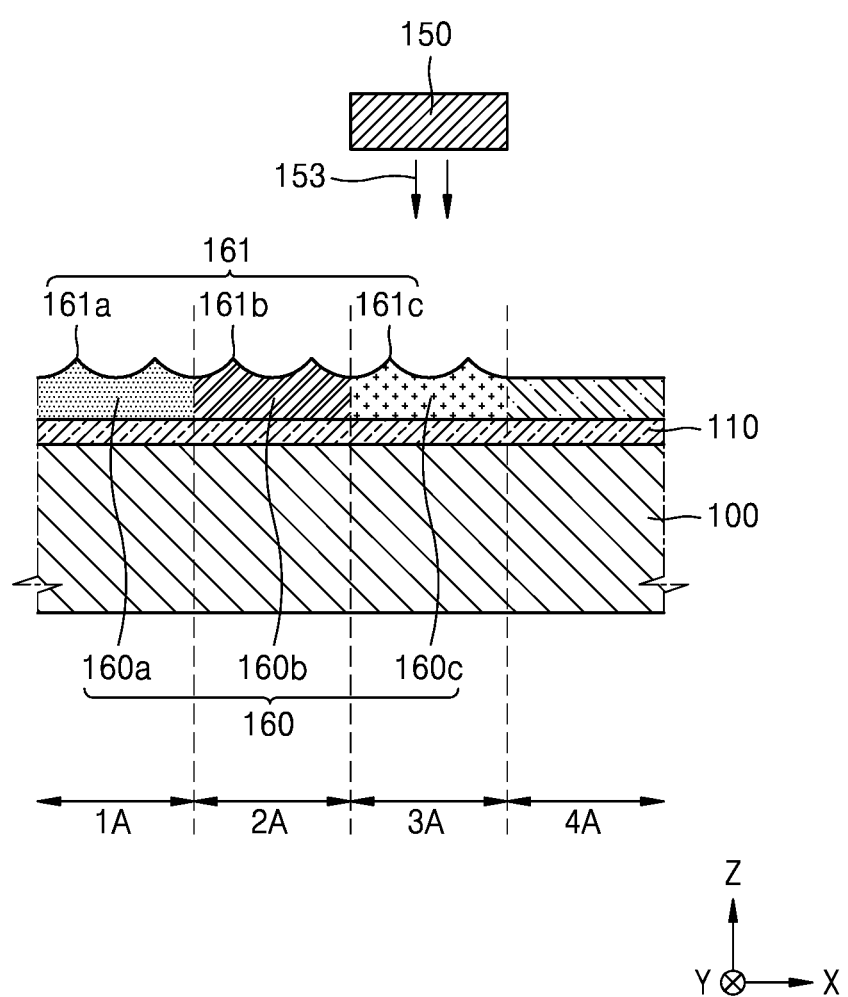

METHOD FOR MANUFACTURING DISPLAY APPARATUS

CROSS-REFERENCE TO RELATED APPLICATION(S)

This application claims priority to and benefits of Korean Patent Application No. 10-2020-0033305 under 35 U.S.C. § 119, filed in the Korean Intellectual Property Office on Mar. 18, 2020, the entire contents of which are incorporated herein by reference.

BACKGROUND

1. Technical Field

One or more embodiments of the disclosure relate to a manufacturing method of a display apparatus having improved reliability.

2. Description of the Related Art

In general, a display apparatus such as an organic light-emitting display apparatus may include a thin film transistor for driving a pixel, and the thin film transistor may include an active layer including polycrystalline silicon.

To form the active layer of the thin film transistor into a polycrystalline silicon thin film, a method of depositing amorphous silicon on a substrate and crystallizing the same or a method of directly depositing polysilicon may be used.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A distribution of thin film transistors may increase, an afterimage may be viewed, and other problems may occur due to protrusions formed while amorphous silicon may be crystallized into polycrystalline silicon.

The disclosure is designed to solve various problems including the aforementioned problems and thus provides a manufacturing method of a display apparatus that may decrease a distribution of thin film transistors, prevent an afterimage from being viewed, and improve reliability. However, this is merely an example, and the scope of the disclosure is not limited by the above effects.

Additional aspects will be set forth in part in the description which follows and, in part, will be apparent from the description, or may be learned by practice of the presented embodiments of the disclosure.

According to one or more embodiments, a manufacturing method of a display apparatus may include preparing a substrate, forming an amorphous silicon layer on the substrate, cleaning the amorphous silicon layer with hydrofluoric acid, crystallizing the amorphous silicon layer into a polycrystalline silicon layer, and forming a metal directly layer on the polycrystalline silicon layer.

The metal layer may include at least one of aluminum and copper.

The metal layer may have a thickness between about 100 Å and about 700 Å, and may be formed on the polycrystalline silicon layer.

The crystallizing of the amorphous silicon layer may include irradiating laser beams having different energy densities onto areas of the substrate.

The energy densities of the laser beams may be between about 300 mJ/cm$^2$ and about 500 mJ/cm$^2$.

The polycrystalline silicon layer may include protrusions having a thickness of about 3 nm or less on a surface of the polycrystalline silicon layer.

The manufacturing method may further include, after the cleaning of the amorphous silicon layer with the hydrofluoric acid, cleaning the amorphous silicon layer with deionized water to which hydrogen may be added.

The metal layer may include at least one of aluminum and copper.

The manufacturing method may further include irradiating light onto the metal layer.

The cleaning of the amorphous silicon layer may include removing an oxide layer formed on a surface of the amorphous silicon layer by spraying the hydrofluoric acid on the amorphous silicon layer.

The hydrofluoric acid may include hydrofluoric fluoride of about 0.5%.

The manufacturing method may further include forming a buffer layer on the substrate between the preparing of the substrate and the forming of the amorphous silicon layer on the substrate.

According to one or more embodiments, a manufacturing method of a display apparatus may include preparing a substrate on which a first area and a second area may be defined, forming an amorphous silicon layer on the substrate, cleaning the amorphous silicon layer with hydrofluoric acid, crystallizing the amorphous silicon layer into a polycrystalline silicon layer by irradiating laser beams having different energy densities onto the first area and the second area, and forming a metal layer directly on the polycrystalline silicon layer.

The metal layer may include at least one of aluminum and copper.

The metal layer may have a thickness between about 100 Å and about 700 Å, and may be formed on the polycrystalline silicon layer.

The polycrystalline silicon layer may include protrusions having a thickness of about 3 nm or less on a surface of the polycrystalline silicon layer.

The manufacturing method may further include irradiating light onto the metal layer.

The manufacturing method may further include, after the cleaning of the amorphous silicon layer with the hydrofluoric acid, cleaning the amorphous silicon layer with deionized water to which hydrogen may be added.

The metal layer may include at least one of aluminum and copper.

The manufacturing method may further include, between the preparing of the substrate and the forming of the amorphous silicon layer on the substrate, forming a buffer layer on the substrate.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
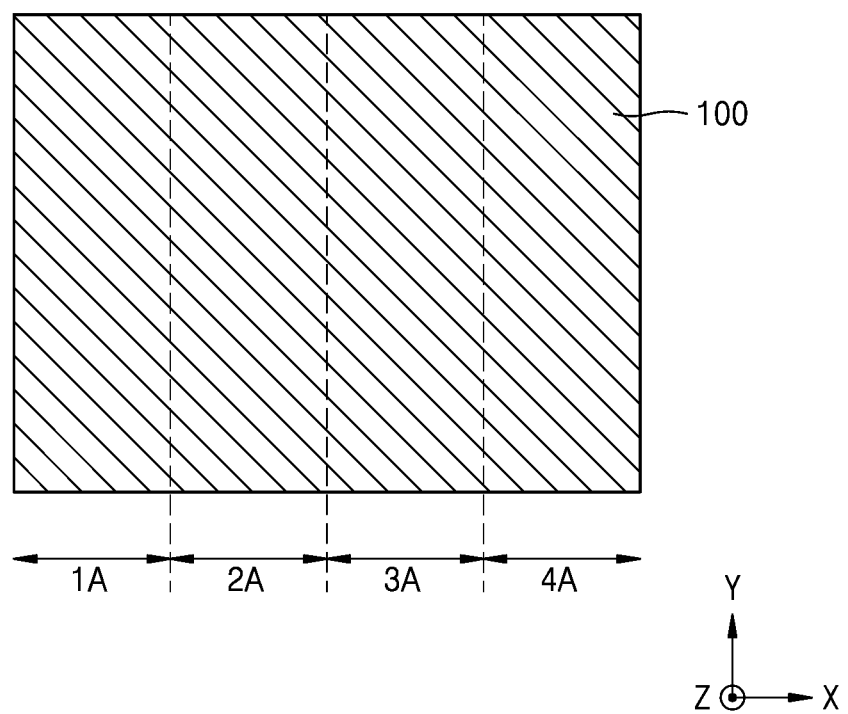
FIG. 1 is a schematic plan view of a manufacturing method of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b, and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating embodiments of the disclosure are referred to in order to gain a sufficient understanding of the disclosure, the merits thereof, and the objectives accomplished by the implementation of the disclosure. The disclosure may, however, be embodied in many different forms and should not be construed as being limited to the embodiments set forth herein.

It will be understood that although the terms "first," "second," etc. may be used herein to describe various components, these components should not be limited by these terms. These terms are only used to distinguish one component from another.

As used herein, the singular forms "a," "an" and "the" are intended to include the plural forms as well, unless the context clearly indicates otherwise.

It will be further understood that the terms "comprises", "has", "including", and the like used herein specify the presence of stated features or components, but do not preclude the presence or addition of one or more other features or components.

It will be understood that when a layer, region, or component is referred to as being formed on another layer, region, or component, it can be directly or indirectly formed on the other layer, region, or component.

Sizes of components in the drawings may be exaggerated for convenience of explanation. In other words, since sizes and thicknesses of components in the drawings may be arbitrarily illustrated for convenience of explanation, the following embodiments are not limited thereto.

An expression such as "A and/or B" indicates A, B, or A and B.

In embodiments described below, the description that lines extend "in a first direction or a second direction" includes that the lines extend in a straight line and includes that the lines extend in a zigzag shape or a curved line along a first direction or a second direction.

In embodiments below, when components "overlap" each other, the components may overlap "on a plane" and "a cross-section." The expression "do not overlap" may include "apart from" or "set aside from" or "offset from" and any other suitable equivalents as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

While a particular order may be presented with respect to a process, the order may be varied in other embodiments. For example, two sequential steps may be performed simultaneously, or in a different order.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, the embodiments of the disclosure will be described in detail with reference to the attached drawings, and like reference numerals in the drawings denote like reference elements.

FIG. 1 is a schematic plan view of a manufacturing method of a display apparatus according to an embodiment, and FIGS. 2 to 8 are schematic cross-sectional views of a manufacturing method of a display apparatus according to an embodiment.

Hereinafter, a manufacturing method of a display apparatus will be sequentially described with reference to FIGS. 1 to 8.

Referring to FIGS. 1 to 8, the manufacturing method of the display apparatus may include preparing a substrate 100, forming an amorphous silicon layer 120 on the substrate 100, cleaning the amorphous silicon layer 120 with hydrofluoric acid 130, crystalizing the amorphous silicon layer 120 into a polycrystalline silicon layer 160, and forming a metal layer 170 on (e.g., directly on) the polycrystalline silicon 160.

Also, the manufacturing method may further include forming a buffer layer 110 on the substrate 100 after the preparing of a substrate 100, and may further include cleaning the amorphous silicon layer 120 with deionized water 140, to which hydrogen may be added, after the cleaning of the amorphous silicon layer 120 with hydrofluoric acid 130.

Referring to FIG. 1, the substrate 100 may be prepared first. Multiple areas may be defined on the substrate 100. In an embodiment, on the substrate 100, a first area 1A, a second area 2A, a third area 3A, and a fourth area 4A may be defined. FIG. 1 illustrates that four areas may be defined on the substrate 100, but one or more embodiments are not limited thereto. For example, in addition to the first area 1A, the second area 2A, the third area 3A, and the fourth area 4A, a fifth area and a sixth area may be defined on the substrate 100.

The substrate 100 may include glass, quartz, ceramic, or the like, or a combination thereof. Also, the substrate 100 may include polymer resin such as polyether sulfone, polyacrylate, polyether imide, polyethylene naphthalate, polyethylene terephthalate, polyphenylene sulfide, polyarylate, polyimide (PI), polycarbonate, cellulose acetate propionate, or the like, or a combination thereof. The substrate 100 including polymer resin may be flexible, rollable, or bendable. The substrate 100 may have a multilayered structure including a layer including the polymer resin and an inorganic layer.

Figure 2:
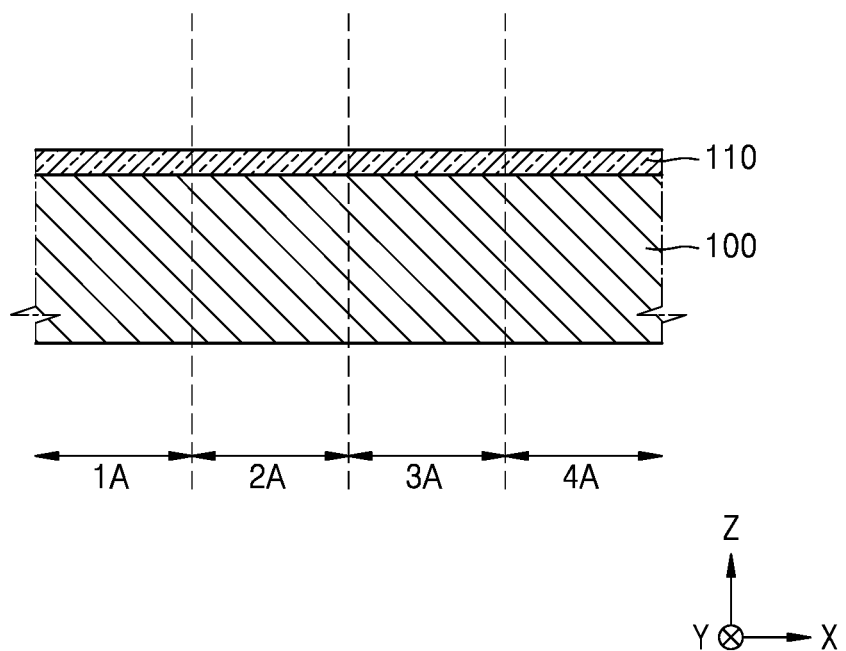
FIGS. 2 to 8 are schematic cross-sectional views of a manufacturing method of a display apparatus according to an embodiment.

Referring to FIG. 2, after the preparing of the substrate 100, the buffer layer 110 may be formed on the substrate 100.

The buffer layer 110 may be disposed on the substrate 100 and provide a flat surface thereon. The buffer layer 110 may include an inorganic material such as oxide or nitride, an organic material, or a composite of organic/inorganic materials and may have a single-layer structure or a multilayered structure including an organic material and an inorganic material. In an embodiment, the buffer layer 110 may include silicon oxide ($SiO_2$) or silicon nitride ($SiN_X$).

Figure 3:
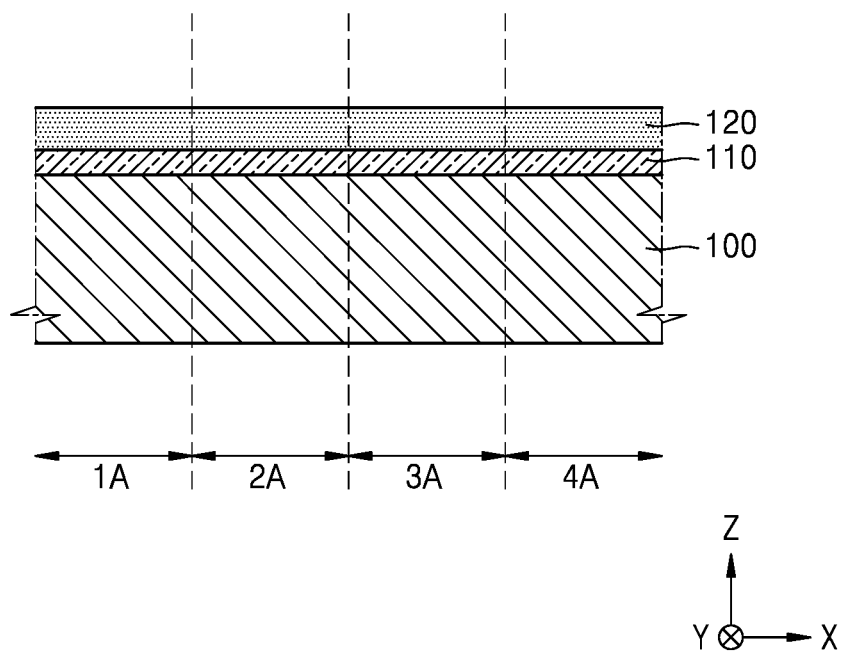
Figure 4:
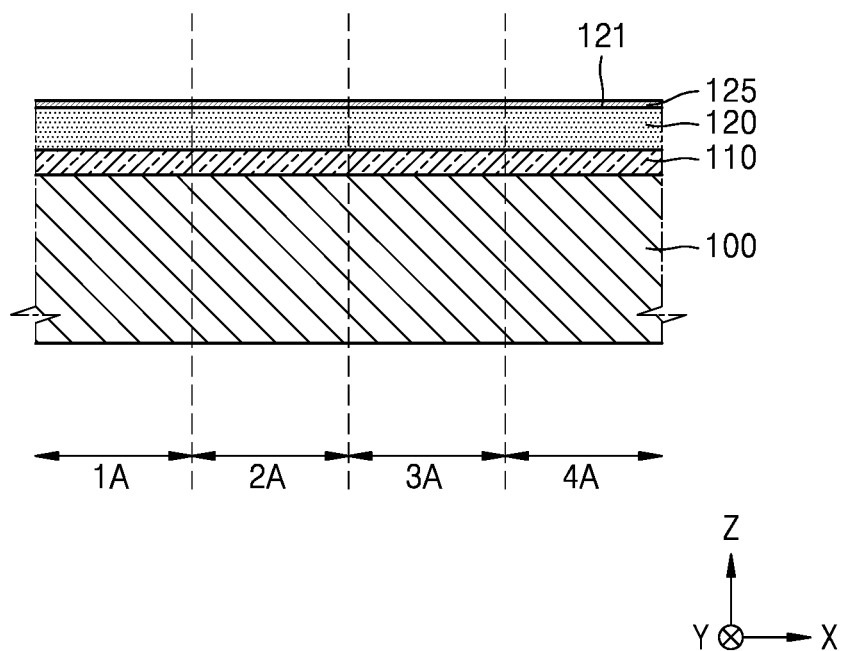

Referring to FIGS. 3 and 4, after the forming of the buffer layer 110 on the substrate 100, forming of the amorphous silicon layer 120 on the buffer layer 110 may be performed.

On the buffer layer 110, the amorphous silicon layer 120 may be formed. The amorphous silicon layer 120 may be formed by using low pressure chemical vapor deposition (LPCVD), atmospheric pressure chemical vapor deposition (APCVD), plasma-enhanced chemical vapor deposition (PECVD), sputtering, vacuum deposition, or the like.

Referring to FIG. 4, when the amorphous silicon layer 120 may be formed on the buffer layer 110, an oxide layer 125 may be naturally formed on a surface 121 of the amorphous silicon layer 120. When the oxide layer 125 may be formed on the surface 121 of the amorphous silicon layer 120, protrusions having relatively great thicknesses may be formed on a surface of the polycrystalline silicon layer 160 while the amorphous silicon layer 120 may be crystallized into the polycrystalline silicon layer 160. Therefore, before the amorphous silicon layer 120 may be crystallized into the polycrystalline silicon layer 160, the oxide layer 125 may be removed from the amorphous silicon layer 120.

Figure 5:
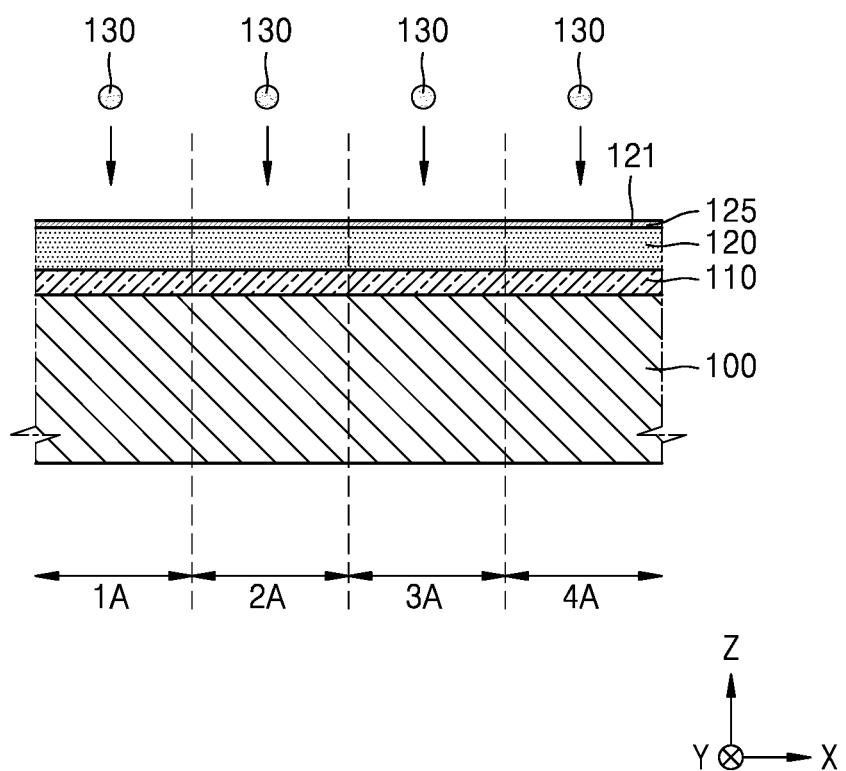

Referring to FIG. 5, after the amorphous silicon layer 120 may be formed on the buffer layer 110, cleaning of the amorphous silicon layer 120 with hydrofluoric acid may be performed.

As described above, when the oxide layer 125 may be formed on the surface 121 of the amorphous silicon layer 120, because protrusions having relatively great thicknesses may be formed on a surface of the polycrystalline silicon layer 160 while the amorphous silicon layer 120 into the polycrystalline silicon layer 160, the oxide layer 125 may be removed first, the oxide layer 125 being formed on the surface 121 of the amorphous silicon layer 120 before the crystallization.

When the oxide layer 125 formed on the surface 121 of the amorphous silicon layer 120 may be removed by using water or ozone (O3), the oxide layer 125 formed on the surface 121 of the amorphous silicon layer 120 may not be completely removed, or problems such as existence of a remaining film may occur.

Therefore, according to the manufacturing method according to an embodiment, the amorphous silicon layer 120 may be cleaned by using the hydrofluoric acid 130. In more detail, the oxide layer 125 formed on the surface 121 of the amorphous silicon layer 120 may be removed by spraying the hydrofluoric acid 130 on the amorphous silicon layer 120.

The hydrofluoric acid 130 may be an aqueous solution in which hydrogen fluoride (HF) may be dissolved. In an embodiment, the hydrofluoric acid 130 may include HF of about 0.3%, about 1%, about 0.7%, or the like. For example, the hydrofluoric acid 130 may include HF of about 0.5%.

By cleaning the amorphous silicon layer 120 with the hydrofluoric acid 130 including HF of about 0.5%, the oxide layer 125 formed on the surface 121 of the amorphous silicon layer 120 may be removed.

In case that the amorphous silicon layer 120 may be cleaned for less than about 40 seconds, the oxide layer 125 formed on the surface 121 of the amorphous silicon layer 120 may not be sufficiently removed, and in case that the amorphous silicon layer 120 may be cleaned for more than about 54 seconds, the amorphous silicon layer 120 may be affected by the hydrofluoric acid 130. Thus, the amorphous silicon layer 120 may be cleaned with the hydrofluoric acid 130 for about 40 seconds to about 54 seconds.

Figure 6:
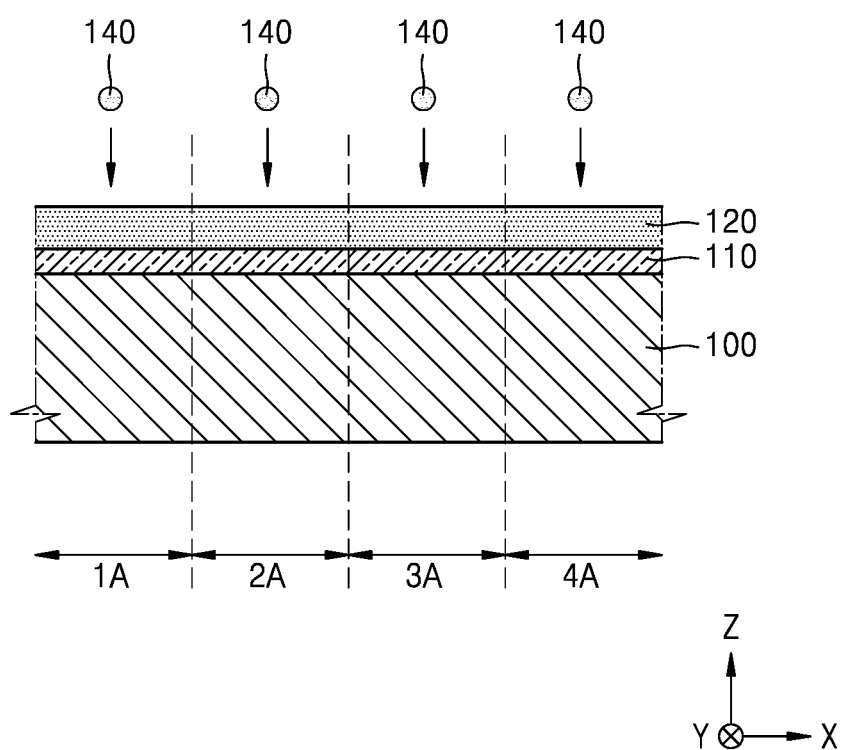

Referring to FIG. 6, after the cleaning of the amorphous silicon layer 120 with the hydrofluoric acid 130, cleaning the amorphous silicon layer 120 with the deionized water 140, to which hydrogen may be added, may be further performed.

In case that the amorphous silicon layer 120 may be cleaned with deionized water to which hydrogen may not be added, oxygen included in the deionized water may remain on the amorphous silicon layer 120, and due to the remaining oxygen, a rounded indication may occur. However, according to the manufacturing method according to an embodiment, the amorphous silicon layer 120 may be cleaned with the deionized water 140 to which hydrogen may be added, and thus, the rounded indication may be prevented.

The amorphous silicon layer 120 may be cleaned with the deionized water 140 to which hydrogen may be added. In an embodiment, hydrogen of about 2.0 ppm, about 0.5 ppm, about 1.5 ppm, or the like may be added to the deionized water 140. For example, hydrogen of about 1.0 ppm may be added to the deionized water 140.

In an embodiment, the amorphous silicon layer 120 may be cleaned by dropping the deionized water 140 including hydrogen in a free-fall manner and cleaned by jetting the deionized water 140 including hydrogen through a spray. The amorphous silicon layer 120 may be cleaned by dropping the deionized water 140 including hydrogen in a free-fall manner and adding megasonic vibrations to the deionized water 140 including hydrogen.

Referring to FIGS. 7A to 7D, after the amorphous silicon layer 120 may be cleaned with the deionized water 140 including hydrogen, the amorphous silicon layer 120, may be crystallized into the polycrystalline silicon layer 160.

The polycrystalline silicon layer 160 may be formed by irradiating a laser beam onto the amorphous silicon layer 120. Laser 150 may intermittently generate laser beams and irradiate the laser beams onto the amorphous silicon layer 120. For example, the laser 150 may be an excimer laser that generates laser beams that have short wavelengths, large outputs, and high efficiency. The excimer laser may include, for example, inert gas, inert-gas halide, mercuric halide, inert-gas acid compound, poly-excimers, or a combination thereof. For example, the inert gas may include Are, $Kr_2$, $Xe_2$, and the like, the inert-gas halide may include ArF, ArCl, KrF, KrCl, XeF, XeCl, and the like, the mercuric halide may include HgCl, HgBr, HgI, and the like, the inert-gas acid compound may include ArO, KrO, XeO, and the like, and the poly-excimers may include $Kr_2F$, $Xe_2F$, and the like.

In the crystallizing of the amorphous silicon layer 120 into the polycrystalline silicon layer 160, energy density of the laser beam may be between about 300 mJ/cm$^2$ and about 500 mJ/cm$^2$, between about 350 mJ/cm$^2$ and about 450 mJ/cm$^2$, between about 400 mJ/cm$^2$ and about 500 mJ/cm$^2$, or the like. For example, the energy density of the laser beam may be between about 430 mJ/cm$^2$ and about 500 mJ/cm$^2$.

In case that the laser beam may be irradiated onto the amorphous silicon layer 120 in a solid state, the amorphous silicon layer 120 may absorb heat, may be transformed into a liquid state, and may be transformed into the solid state again by emitting the heat. Crystals may grow from crystal seeds, and thus grains may be formed. In case that cooling rates differ while a state of the amorphous silicon layer 120 may be changed from the liquid state to the solid state, the grains may grow from a region where the cooling rate may be high to a region where the cooling rate may be low, and a grain boundary may be formed in the region where the cooling rate may be low.

On the surface of the polycrystalline silicon layer 160 on which a crystallization process may be performed, protrusions 161 may be formed at the grain boundary. The amorphous silicon layer 120 that may be fused by the laser beam may be re-crystallized with respect to the grains, and thus the protrusions 161 may be formed at the grain boundary.

The protrusions 161 may protrude from the surface of the polycrystalline silicon layer 160 upwards and may have sharp ends. An effective value of the surface roughness of the polycrystalline silicon layer 160 may be less than or equal to about 3 nm. The protrusion 161 may have a thickness corresponding to a distance from the surface of the polycrystalline silicon layer 160 to the end of the protrusion 161. For example, the protrusions 161 having a thickness of about 3 nm or less may be on the surface of the polycrystalline silicon layer 160.

By performing the cleaning process using the hydrofluoric acid 130 and the cleaning process using the deionized water 140 including hydrogen before the crystallization process, thicknesses of the protrusions 161, which may be formed on the surface of the polycrystalline silicon layer 160, decrease, and the polycrystalline silicon layer 160 having relatively low surface roughness may be formed.

In the crystallizing of the amorphous silicon layer 120 into the polycrystalline silicon layer 160, laser beams having different energy densities may be irradiated onto respective areas of the substrate 100, thus crystallizing the amorphous silicon layer 120, having been cleaned, into the polycrystalline silicon layer 160.

In more detail, the laser beams having different energy densities may be respectively irradiated onto the first area 1A, the second area 2A, the third area 3A, and the fourth area 4A, which may be defined on the substrate 100, and thus the amorphous silicon layer 120, having been cleaned, may be crystallized into the polycrystalline silicon layer 160.

Figure 7A:
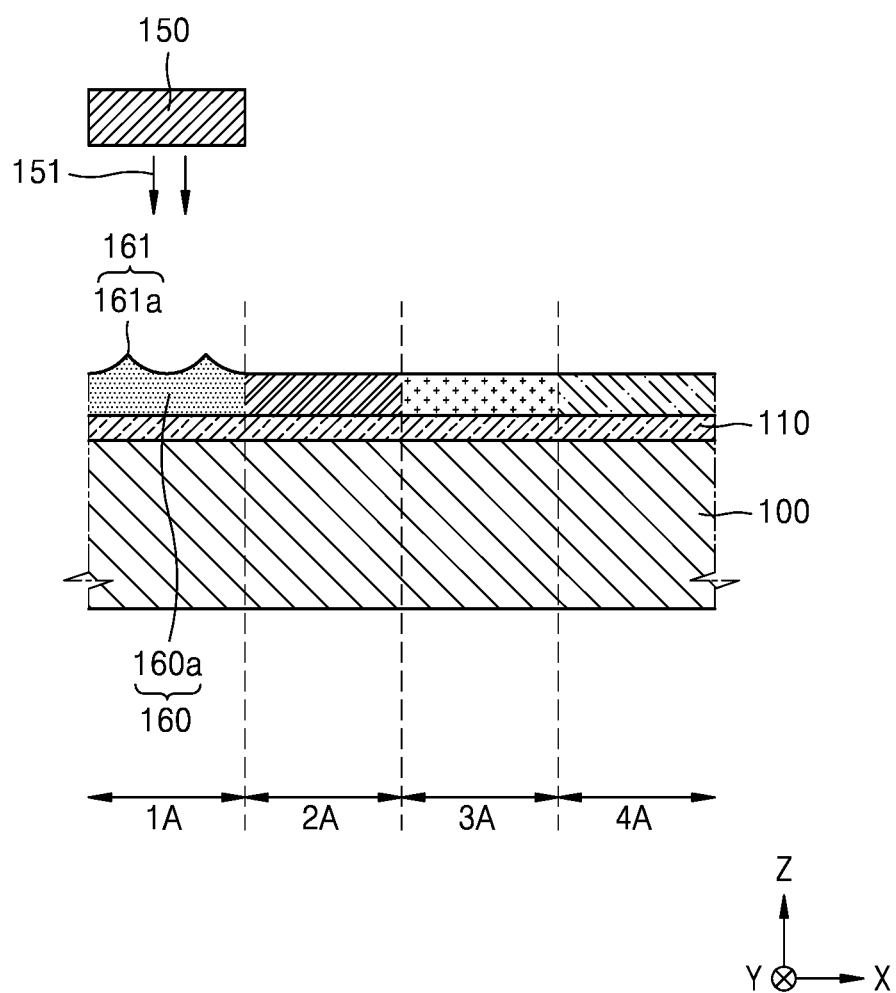

As illustrated in FIG. 7A, a first laser beam 151 having a first energy density may be irradiated onto the first area 1A of the substrate 100, and the amorphous silicon layer 120, which may be disposed in the first area 1A of the substrate 100, may be crystallized into a first polycrystalline silicon layer 160a. First protrusions 161a may be formed on a surface of the first polycrystalline silicon layer 160a.

Figure 7B:
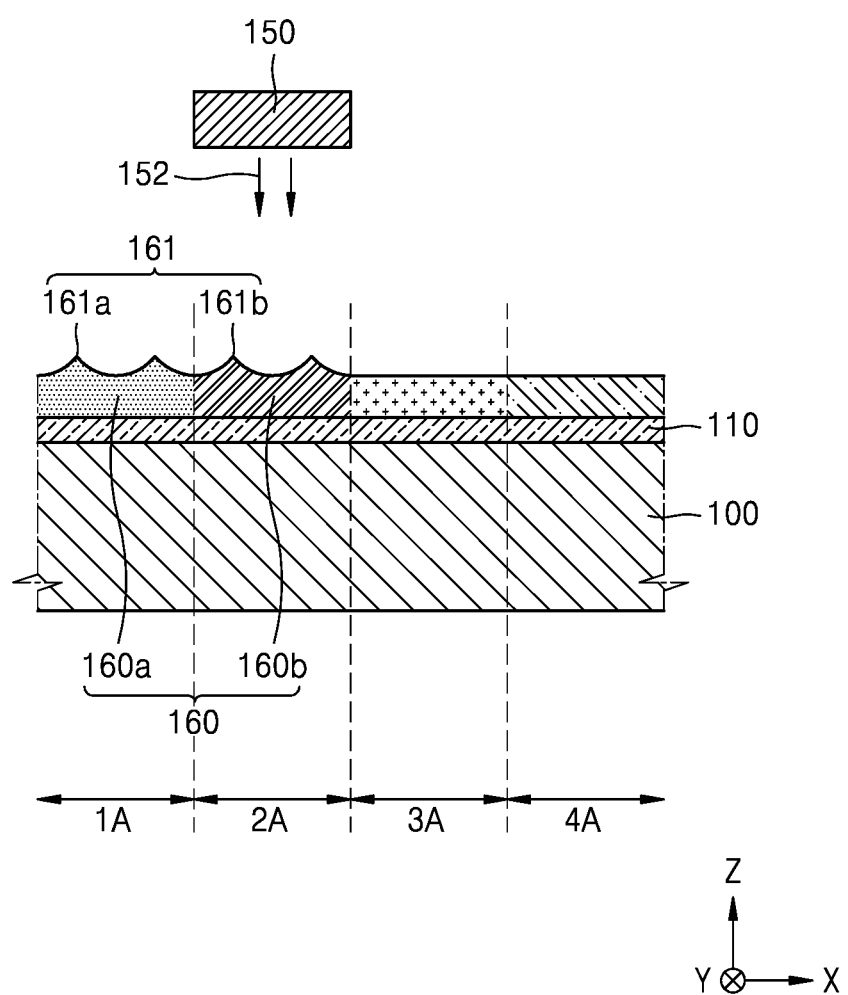

As illustrated in FIG. 7B, a second laser beam 152 having a second energy density may be irradiated onto the second area 2A of the substrate 100, and the amorphous silicon layer 120, which may be disposed in the second area 2A of the substrate 100, may be crystallized into a second polycrystalline silicon layer 160b. Second protrusions 161b may be formed on a surface of the second polycrystalline silicon layer 160b.

As illustrated in FIG. 7C, a third laser beam 153 having a third energy density may be irradiated onto the third area 3A of the substrate 100, and the amorphous silicon layer 120, which may be disposed in the third area 3A of the substrate 100, may be crystallized into a third polycrystalline silicon layer 160c. Third protrusions 161c may be formed on a surface of the third polycrystalline silicon layer 160c.

Figure 7D:
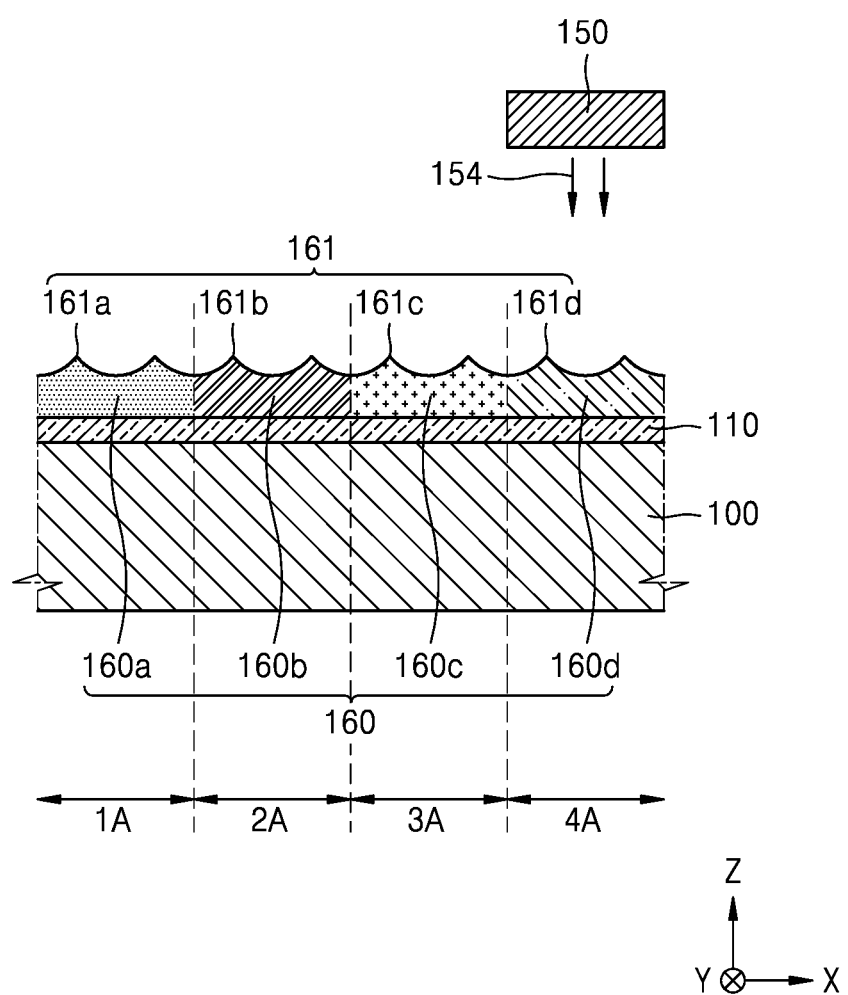

As illustrated in FIG. 7D, a fourth laser beam 154 having a fourth energy density may be irradiated onto the fourth area 4A of the substrate 100, and the amorphous silicon layer 120, which may be disposed in the fourth area 4A of the substrate 100, may be crystallized into a fourth polycrystalline silicon layer 160d. Fourth protrusions 161d may be formed on a surface of the fourth polycrystalline silicon layer 160d.

Also, in case that other areas such as a fifth area and a sixth area may be defined on the substrate 100 in addition to the first area 1A, the second area 2A, the third area 3A, and the fourth area 4A, laser beams having different energy densities may be irradiated onto the areas, respectively.

Because the laser beams having different energy densities may be respectively irradiated onto the areas of the substrate 100, the protrusions 161, which may be formed on the polycrystalline silicon layers 160 in respective areas, may have different arrangements. For example, in the first area 1A of the substrate 100, arrangements of the first protrusions 161a of the first polycrystalline silicon layer 160a may differ from arrangements of the second protrusions 161b of the second polycrystalline silicon layer 160b.

Figure 8:
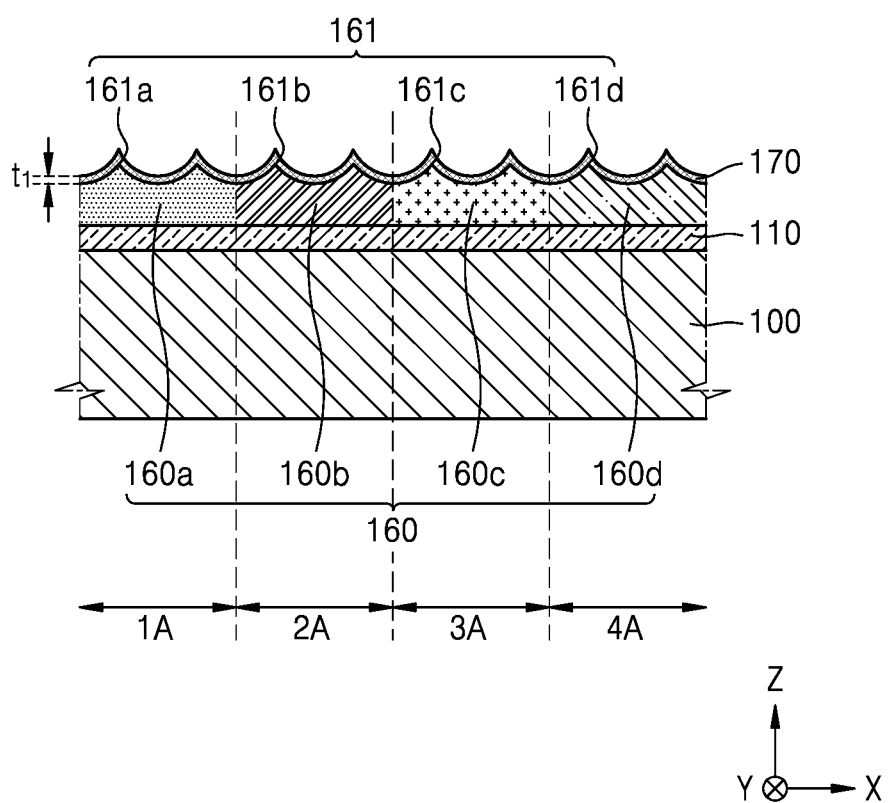

Referring to FIG. 8, after the amorphous silicon layer 120, having been cleaned, may be crystallized into the polycrystalline silicon layer 160, the metal layer 170 may be further formed on (e.g., directly on) the polycrystalline silicon layer 160.

Also, in an embodiment, after the metal layer 170 may be formed on (e.g., directly on) the polycrystalline silicon layer 160, irradiating a laser beam onto the metal layer 170 and selecting an optimum energy density of the laser beam by using light reflected from the metal layer 170 may be further performed.

According to an embodiment, by performing the cleaning process using the hydrofluoric acid 130 and the cleaning process using the deionized water 140 including hydrogen before the crystallization process, thicknesses of the protrusions 161, which may be formed on the surface of the polycrystalline silicon layer 160, decrease, and the polycrystalline silicon layer 160 having relatively low surface roughness may be formed.

Because the laser beams having different energy densities may be respectively irradiated onto the areas of the substrate 100, the protrusions 161, which may be formed on a surface of the polycrystalline silicon layer 160 in respective areas of the substrate 100, may have different arrangements. In case that light may be irradiated onto the surface of the polycrystalline silicon layer 160 including the protrusions 161, vertical stains may be viewed due to the arrangements of the protrusions 161 formed on the surface of the polycrystalline silicon layer 160. The vertical stains may cause a failure of the display apparatus, and thus, it may be recommended to crystallize amorphous silicon into polycrystalline silicon according to a laser energy density in which the vertical stains may not be viewed.

However, in case that an optimum energy density of a laser beam is determined by using light irradiated onto the polycrystalline silicon layer 160 and reflected therefrom, the reflected light increasingly scatters due to the reduced thicknesses of the protrusions 161, and thus, it may be difficult to determine an optimum energy density due to an increase in the scattering of the reflected light.

Therefore, according to the disclosure, the metal layer 170 including metal having great reflectivity may be formed on (e.g., directly on) the polycrystalline silicon layer 160, and thus, an optimum energy density of a laser beam may be easily determined.

The metal layer 170 may be formed on (e.g., directly on) the polycrystalline silicon layer 160. The metal layer 170 may include metal having great reflectivity. For example, the metal layer 170 may include at least one of Al and Cu.

The metal layer 170 may have a first thickness t1 from an upper surface of the polycrystalline silicon layer 160. In an embodiment, the metal layer 170 may have a thickness between about 1 Å and about 700 Å, between about 50 Å and about 500 Å, between about 100 Å and about 400 Å, or the like from the upper surface of the polycrystalline silicon layer 160. For example, the metal layer 170 may have a thickness between about 100 Å and about 300 Å from the upper surface of the polycrystalline silicon layer 160.

The optimum energy density of the laser beam may be determined by irradiating the laser beam onto the metal layer 170 including Al or Cu and using the light reflected from the metal layer 170. The optimum energy density of a laser beam may be determined by using the light reflected from the metal layer 170 according to various methods such as a micro inspection or an optical sensor.

The optimum energy density of the laser beam, which may be determined according to the above method, may be applied to processes of crystallizing an amorphous silicon layer for mass production.

Figure 9:
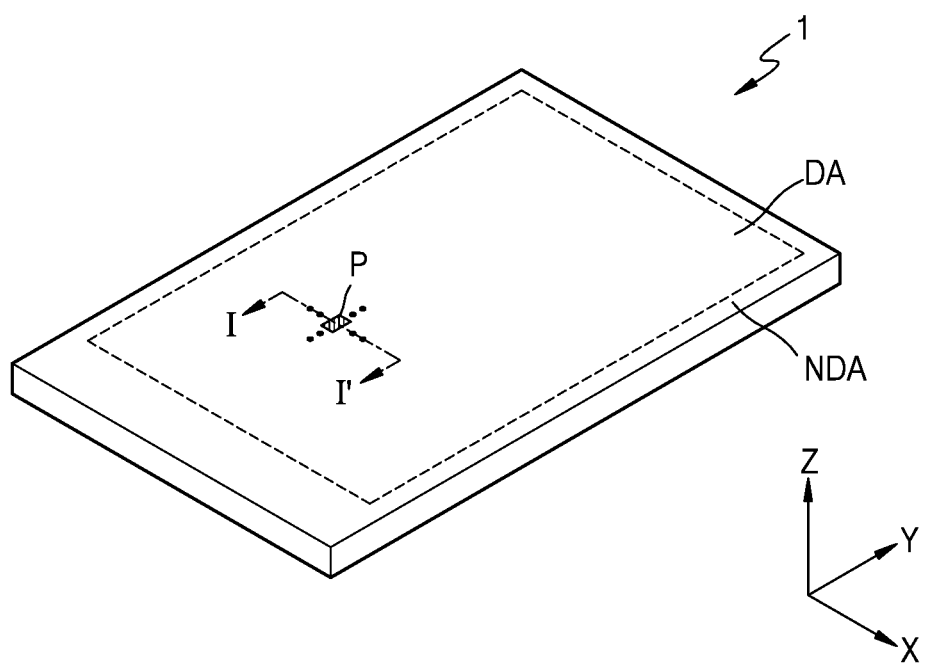
FIG. 9 is a schematic perspective view of a display apparatus according to an embodiment.
Figure 10:
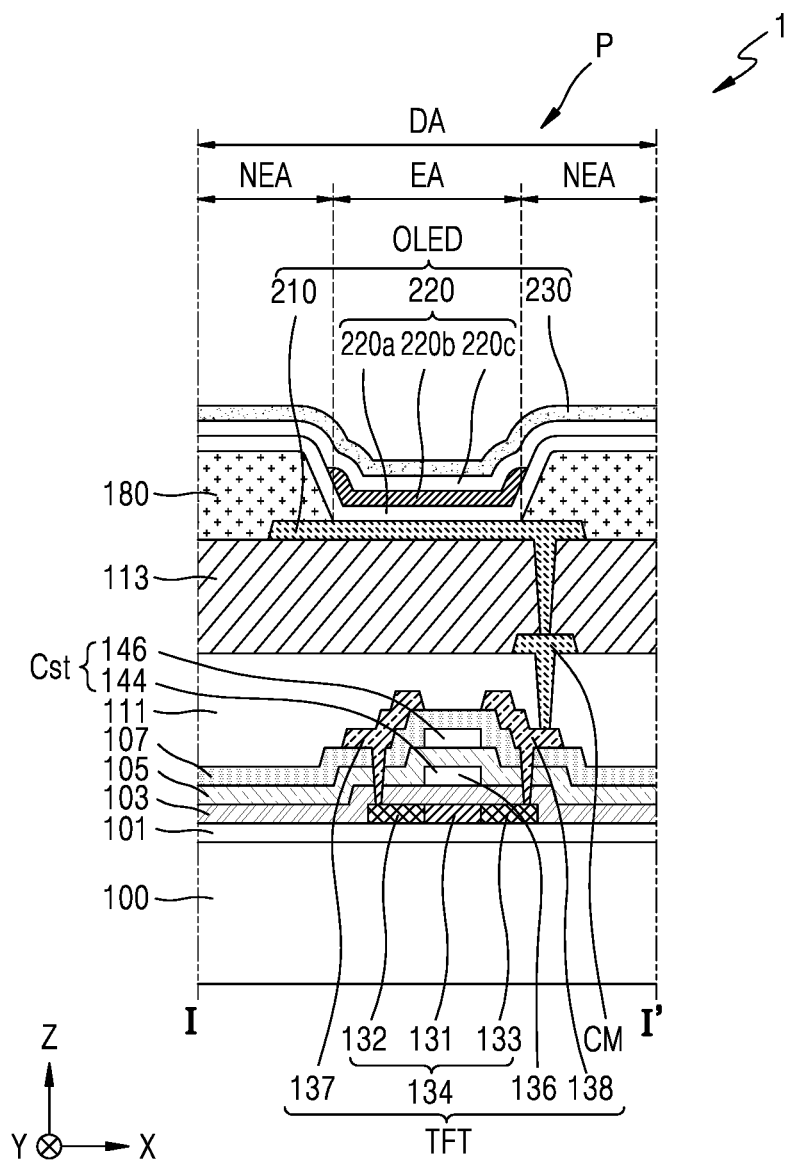
FIG. 10 is a schematic cross-sectional view of a display apparatus according to an embodiment.

FIG. 9 is a schematic perspective view of a display apparatus according to an embodiment, and FIG. 10 is a schematic cross-sectional view of a display apparatus according to an embodiment.

Referring to FIG. 9, a display apparatus 1 may include a display area DA and a non-display area NDA adjacent to (e.g., around) the display area DA. The non-display area NDA may surround the display area DA. The display apparatus 1 may provide an image by using light emitted from pixels P arranged in the display area DA, and the non-display area NDA may be an area where an image may not be displayed.

Hereinafter, the display apparatus 1 according to an embodiment may be an organic light-emitting display apparatus, but one or more embodiments are not limited thereto. In an embodiment, the display apparatus 1 may be an inorganic light-emitting display (or an inorganic EL display) apparatus, a quantum dot light-emitting display apparatus, or the like. For example, an emission layer of a display element included in the display apparatus 1 may include an organic material, an inorganic material, quantum dots, an organic material and quantum dots, or an inorganic material and quantum dots.

FIG. 9 illustrates that the display apparatus 1 has a flat display surface, but one or more embodiments are not limited thereto. In an embodiment, the display apparatus 1 may include a cubic display surface or a curved display surface.

In case that the display apparatus 1 includes a cubic display surface, the display apparatus 1 may include display areas directed in different directions, for example, may include multifaceted cylindrical display surfaces. In an embodiment, in case that the display apparatus 1 includes a curved display surface, the display apparatus 1 may be flexible, foldable, rollable, or the like.

FIG. 9 illustrates the display apparatus 1 that may be applied to a mobile terminal. Although not illustrated, electronic modules, camera modules, power modules, and the like, which may be embedded in a main board, may be located in brackets, cases, or the like together with the display apparatus 1, thereby forming the mobile terminal. In particular, the display apparatus 1 according to an embodiment may be applied to a large electronic apparatus such as a television or a monitor, a small- and medium-sized electronic apparatus such as a tablet computer, a navigation device of an automobile, a game device, or a smart watch, or the like.

FIG. 9 illustrates that the display apparatus 1 includes the display area DA that may be rectangular, but a shape of the display area DA may vary, for example, a circle, an oval, or a polygon such as a triangle or a pentagon.

The display apparatus 1 may include multiple pixels P arranged in the display area DA. Each pixel P may include an organic light-emitting diode OLED. Each pixel P may emit, for example, red light, green light, blue light, or white light from the organic light-emitting diode OLED. In the specification, each pixel P may be understood as a pixel emitting any one of red light, green light, blue light, and white light, as described above.

Referring to FIG. 10, a display element may be disposed on the substrate 100. The display element may include a thin film transistor TFT and the organic light-emitting diode OLED.

The substrate 100 may include glass, polymer resin, or a combination thereof. The polymer resin may include polyether sulfone, polyacrylate, polyether imide, polyethylene naphthalate, polyethylene terephthalate, polyphenylene sulfide, polyarylate, polyimide, polycarbonate, cellulose acetate propionate, or the like, or a combination thereof. The substrate 100 including the polymer resin may be flexible, rollable, or bendable. The substrate 100 may have a multilayered structure including a layer including the polymer resin and an inorganic layer.

A buffer layer 101 may be disposed on the substrate 100. The buffer layer 101 disposed on the substrate 100 may prevent the penetration of foreign materials, moisture, or external air from the bottom of the substrate 100 and may provide a planar surface on the substrate 100. The buffer layer 101 may include an inorganic material such as oxide or nitride, an organic material, or a composite of organic/inorganic materials and may have a single-layer structure or a multilayered structure including an inorganic material and an organic material.

The thin film transistor TFT may be disposed on the buffer layer 101. The thin film transistor TFT may include a semiconductor layer 134, a gate electrode 136 overlapping the semiconductor layer 134, and a connection electrode electrically connected to the semiconductor layer 134. The thin film transistor TFT may be electrically connected to the organic light-emitting diode OLED and drive the same.

The semiconductor layer 134 may be disposed on the buffer layer 101 and include a channel area 131 overlapping the gate electrode 136 and source and drain areas 132 and 133 disposed on both sides of the channel area 131 and including impurities having high density. Here, the impurities may include N-type impurities or P-type impurities. The source area 132 and the drain area 133 may be electrically connected to the connection electrode.

The semiconductor layer 134 may include polycrystalline silicon formed by crystallizing a-Si. For example, the semiconductor layer 134 may include polycrystalline silicon formed according to the optimum energy density of the laser beam that may be selected according to the above manufacturing method.

On the semiconductor layer 134, a first insulating layer 103 may be disposed. The first insulating layer 103 may include at least one inorganic insulating material selected from the group of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may include a single layer or layers including the inorganic material(s).

On the first insulating layer 103, the gate electrode 136 may be disposed. The gate electrode 136 may be a single layer or layers including at least one metal selected from the group of Al, Pt, Pd, Ag, Mg, Au, Ni, Nd, Ir, Cr, Li, Ca, Mo, Ti, W, and Cu. The gate electrode 136 may be electrically connected to a gate line for transmitting an electrical signal to the gate electrode 136.

On the gate electrode 136, a second insulating layer 105 may be disposed. The second insulating layer 105 may include at least one inorganic material selected from the group of $SiO_2$, $SiN_x$, $SiO_xN_y$, $Al_2O_3$, $TiO_2$, $Ta_2O_5$, $HfO_2$, and $ZnO_2$. The second insulating layer 105 may be a single layer or layers including the above inorganic material(s).

On the first insulating layer 103, a storage capacitor Cst may be disposed. The storage capacitor Cst may include a lower electrode 144 and an upper electrode 146 overlapping the lower electrode 144. The lower electrode 144 and the upper electrode 146 of the storage capacitor Cst may overlap each other with the second insulating layer 105 therebetween.

The lower electrode 144 of the storage capacitor Cst may overlap the gate electrode 136 of the thin film transistor TFT and may be integrally arranged with the gate electrode 136 of the thin film transistor TFT. In an embodiment, the storage capacitor Cst may not overlap the thin film transistor TFT, and the lower electrode 144 of the storage capacitor Cst may be separate from the gate electrode 136 of the thin film transistor TFT.

The upper electrode 146 of the storage capacitor Cst may include Al, Pt, Pd, Ag, Mg, Au, Ni, Nd, Ir, Cr, Li, Ca, Mo, Ti, W, and/or Cu and may be a single layer or layers including the above material(s).

On the upper electrode 146 of the storage capacitor Cst, a third insulating layer 107 may be disposed. The third insulating layer 107 may include at least one inorganic insulating material selected from the group of $SiO_2$, $SiN_x$, $SiO_xN_y$, $Al_2O_3$, $TiO_2$, $Ta_2O_5$, $HfO_2$, and $ZnO_2$. The third insulating layer 107 may be a single layer or layers including the above inorganic insulating material(s).

On the third insulating layer 107, a source electrode 137 that may be the connection electrode and a drain electrode 138 may be disposed. The source electrode 137 and the drain electrode 138 may each include a conductive material such as Mo, Al, Cu, or Ti and may each have a single-layer structure or a multilayered structure including the above material. The source electrode 137 and the drain electrode 138 may have a multilayered structure of Ti/Al/Ti.

On the source electrode 137 and the drain electrode 138, a first planarization layer 111 may be disposed. The first planarization layer 111 may be a single layer or layers including an organic material or an inorganic material. In an embodiment, the first planarization layer 111 may include a general-purpose polymer such as benzocyclobutene (BCB), PI, hexamethyldisiloxane (HMDSO), polymethylmethacrylate (PMMA) or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and a blend thereof. The first planarization layer 111 may include $SiO_2$, $SiN_x$, $SiO_xN_y$, $Al_2O_3$, $TiO_2$, $Ta_2O_5$, $HfO_2$, $ZnO_2$, or a combination thereof. After the first planarization layer 111 may be formed, mechanochemical polishing may be performed to provide a planar upper surface.

On the first planarization layer 111, a contact metal layer CM may be disposed. The contact metal layer CM may include Al, Cu, Ti, or the like, or a combination thereof, and may be layers or a single layer. The contact metal layer CM may have a multilayered structure of Ti/Al/Ti.

On the contact metal layer CM, a second planarization layer 113 may be disposed. The second planarization layer 113 may be a single layer or layers including an organic material or an inorganic material. In an embodiment, the second planarization layer 113 may include a general-purpose polymer such as BCB, PI, HMDSO, PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a blend thereof. The second planarization layer 113 may include $SiO_2$, $SiN_x$, $SiO_xN_y$, $Al_2O_3$, $TiO_2$, $Ta_2O_5$, $HfO_2$, $ZnO_2$, or a combination thereof. After the second planarization layer 113 may be formed, mechanochemical polishing may be performed to provide the planar upper surface. In an embodiment, the second planarization layer 113 may not be formed.

On the second planarization layer 113, an organic light-emitting diode OLED including a pixel electrode 210, an intermediate layer 220, and an opposite electrode 230 may be disposed. The pixel electrode 210 may be electrically connected to the contact metal layer CM through a contact hole penetrating the second planarization layer 113, and the contact metal layer CM may be electrically connected to the source electrode 137, which may be the connection electrode of the thin film transistor TFT, and the drain electrode 138 through a contact hole penetrating the first planarization layer 111. Thus, the organic light-emitting diode OLED may be electrically connected to the thin film transistor TFT.

On the second planarization layer 113, the pixel electrode 210 may be disposed. The pixel electrode 210 may be a transparent (translucent) electrode or a reflective electrode. The pixel electrode 210 may include a reflection layer including Al, Pt, Pd, Ag, Mg, Au, Ni, Nd, Ir, Cr, Li, Ca, Mo, Ti, W, Cu, or a combination thereof, and a transparent or translucent electrode layer formed on the reflection layer. The transparent or translucent electrode layer may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stack structure of ITO/Ag/ITO.

A pixel-defining layer 180 may be disposed on the second planarization layer 113 and may include an opening through which at least some portions of the pixel electrode 210 may be exposed. The portions exposed through the opening of the pixel-defining layer 180 may be defined as emission areas EA. Areas adjacent to (e.g., around) emission areas EA may be non-emission areas NEA surrounding the emission areas EA. For example, the display area DA may include the emission areas EA and the non-emission areas NEA surrounding the emission areas EA. The pixel-defining layer 180 may increase a distance between an upper portion of the pixel electrode 210 and the opposite electrode 230 and thus may prevent arcs from being generated at edges of the pixel electrode 210. The pixel-defining layer 180 may include, for example, an organic insulating material such as PI, polyamide, acryl resin, BCB, HMDSO, phenol resin, or a combination thereof, and may be formed by using a spin coating method or the like.

The intermediate layer 220 may be disposed on the pixel electrode 210 of which at least a portion may be exposed by the pixel-defining layer 180. The intermediate layer 220 may include an emission layer 220b, and on and under the emission layer 220b, a first functional layer 220a and a second functional layer 220c may be selectively disposed.

In an embodiment, the intermediate layer 220 may be formed on the pixel electrode 210 of which at least a portion may be exposed by the pixel-defining layer 180. In more detail, the emission layer 220b of the intermediate layer 220 may be formed on the pixel electrode 210 of which at least a portion may be exposed by the pixel-defining layer 180.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent material or a phosphorescent material emitting red light, green light, blue light, or white light. The emission layer 220b may include a low-molecular weight organic material or a high-molecular weight organic material.

In case that the emission layer 220b includes a low-molecular weight organic material, the intermediate layer 220 may have a single-layer structure or a stack structure in which an HIL, an HTL, an emission layer, an EIL, and an ETL may be stacked on each other, and may include various organic materials such as copper phthalocyanine (CuPc), N,N'-Di(napthalene-1-yl)-N,N'-diphenyl-benzidine (NPB), and tris-8-hydroxyquinoline aluminum ($Alq_3$) as low-molecular organic materials. Such layers may be formed by using a vacuum deposition method.

In case that the emission layer 220b includes a high-molecular weight organic material, the intermediate layer 220 may have a structure including the HTL and the emission layer. The HTL may include PEDOT, and the emission layer may include a high-molecular weight material such as a poly-phenylene vinylene (PPV)-based material and a polyfluorene-based material. The emission layer may be formed by using a screen printing method, an inkjet printing method, a laser induced thermal imaging (LITI) method, or the like.

On the intermediate layer 220, the opposite electrode 230 may be disposed. The opposite electrode 230 may be disposed on the intermediate layer 220 and may entirely cover the same. The opposite electrode 230 may be above the display area DA and may cover the entire display area DA. For example, the opposite electrode 230 may be integrally formed on the entire display panel to cover the pixels P in the display area DA by using an open mask.

The opposite electrode 230 may include a conductive material having a low work function. For example, the opposite electrode 230 may include a (translucent) transparent layer including Ag, Mg, Al, Pt, Pd, Au, Ni, Nd, Ir, Cr, Li, Ca, or an alloy thereof. In another example, the opposite electrode 230 may further include a layer including ITO, IZO, ZnO, or $In_2O_3$ on the (translucent) transparent layer including the aforementioned materials.

As described above, according to the one or more embodiments, a display apparatus may be realized, the display apparatus decreasing a distribution of thin film transistors, preventing an afterimage from being viewed, and having improved reliability. However, the scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including their equivalents.

What is claimed is:

1. A manufacturing method of a display apparatus, the manufacturing method comprising:
   preparing a substrate;
   forming an amorphous silicon layer on the substrate;
   cleaning the amorphous silicon layer with hydrofluoric acid;
   crystallizing the amorphous silicon layer;
   forming a metal layer directly on the polycrystalline silicon layer; and
   determining an optimum energy density of a laser beam for crystallizing the amorphous silicon layer by using light reflected from the metal layer, the optimum energy density selected from a set of energy densities used to crystallize the amorphous silicon layer.

2. The manufacturing method of claim 1, wherein the metal layer comprises at least one of aluminum and copper.

3. The manufacturing method of claim 1, wherein
   the metal layer has a thickness between about 100 Å and about 700 Å, and is formed on the polycrystalline silicon layer.

4. The manufacturing method of claim 1, wherein the crystallizing of the amorphous silicon layer includes irradiating laser beams having different energy densities onto different areas of the substrate.

5. The manufacturing method of claim 4, wherein the energy densities of the laser beams are between about 300 mJ/cm2 and about 500 mJ/cm2.

6. The manufacturing method of claim 1, wherein the polycrystalline silicon layer comprises protrusions having a thickness of about 3 nm or less on a surface of the polycrystalline silicon layer.

7. The manufacturing method of claim 1, further comprising, after the cleaning of the amorphous silicon layer with the hydrofluoric acid, cleaning the amorphous silicon layer with deionized water to which hydrogen is added.

8. The manufacturing method of claim 7, wherein the metal layer comprises at least one of aluminum and copper.

9. The manufacturing method of claim 1, further comprising irradiating light onto the metal layer.

10. The manufacturing method of claim 1, wherein the cleaning of the amorphous silicon layer includes removing an oxide layer formed on a surface of the amorphous silicon layer by spraying the hydrofluoric acid on the amorphous silicon layer.

11. The manufacturing method of claim 1, wherein the hydrofluoric acid comprises hydrofluoric fluoride of about 0.5%.

12. The manufacturing method of claim 1, further comprising, between the preparing of the substrate and the forming of the amorphous silicon layer on the substrate, forming a buffer layer on the substrate.

13. A manufacturing method of a display apparatus, manufacturing method comprising:
   preparing a substrate, the substrate including a first area and a second area;
   forming an amorphous silicon layer on the substrate;
   cleaning the amorphous silicon layer with hydrofluoric acid;
   crystallizing the amorphous silicon layer into a polycrystalline silicon layer by irradiating laser beams having different energy densities onto the first area and the second area;
   forming a metal layer directly on the polycrystalline silicon layer; and
   determining an optimum energy density of a laser beam for crystallizing the amorphous silicon layer by using light reflected from the metal layer the optimum energy density being selected from one of the different energy densities.

14. The manufacturing method of claim 13, wherein the metal layer comprises at least one of aluminum and copper.

15. The manufacturing method of claim 13, wherein the metal layer has a thickness between about 100 Å and about 700 Å, and is formed on the polycrystalline silicon layer.

16. The manufacturing method of claim 13, wherein the polycrystalline silicon layer comprises protrusions having a thickness of about 3 nm or less on a surface of the polycrystalline silicon layer.

17. The manufacturing method of claim 13, further comprising irradiating light onto the metal layer.

18. The manufacturing method of claim 13, further comprising, after the cleaning of the amorphous silicon layer with the hydrofluoric acid, cleaning the amorphous silicon layer with deionized water to which hydrogen is added.

19. The manufacturing method of claim 18, the metal layer comprises at least one of aluminum and copper.

20. The manufacturing method of claim 13, further comprising, between the preparing of the substrate and the forming of the amorphous silicon layer on the substrate, forming a buffer layer on the substrate.

* * * * *